United States Patent [19]
Moody

[11] Patent Number: 5,466,952
[45] Date of Patent: Nov. 14, 1995

[54] SEMICONDUCTOR DEVICE HAVING AN IGET AND A CONTROL OR PROTECTION COMPONENT

[75] Inventor: Paul T. Moody, Oldham, Great Britain

[73] Assignee: U.S. Philips Corporation, New York, N.Y.

[21] Appl. No.: 269,810

[22] Filed: Jun. 30, 1994

[30] Foreign Application Priority Data

Jul. 1, 1993 [GB] United Kingdom ............ 9313651

[51] Int. Cl.⁶ .................... H01L 29/10; H01L 29/78
[52] U.S. Cl. .................. 257/139; 257/328; 257/355
[58] Field of Search ..................... 257/328, 139, 257/355, 140; 323/284

[56] References Cited

U.S. PATENT DOCUMENTS

| | | | |
|---|---|---|---|
| 4,760,434 | 7/1988 | Tsuzuki et al. | 257/49 |
| 5,352,915 | 10/1994 | Hutchings et al. | 257/328 |

FOREIGN PATENT DOCUMENTS

| | | |
|---|---|---|
| 0360333 | 3/1990 | European Pat. Off. . |
| 0369530 | 5/1990 | European Pat. Off. . |
| 0479362 | 4/1992 | European Pat. Off. . |
| 0523800 | 1/1993 | European Pat. Off. . |

Primary Examiner—Robert P. Limanek
Assistant Examiner—David B. Hardy
Attorney, Agent, or Firm—Steven R. Biren

[57] ABSTRACT

A semiconductor body (2) has first and second major surfaces (2c and 2d) with a first region (2b) of one conductivity type adjacent the first major surface (2c). An insulated gate field effect transistor (6) is formed within the first region (2c) and has source and drain electrodes (S and D) and an insulated gate electrode (G). At least one further component (R4) is coupled between the insulated gate electrode (G) of the insulated gate field effect transistor (6) and a gate input terminal (GT). The further region requires a second region (21) of the opposite conductivity type provided within the first region (2b) so that a region (26) of the further component (R4), the second region (21) and the first region (2b) form a parasitic bipolar transistor (B). An insulating layer (30) on the first major surface (2c) carries a first rectifying element (D1) coupled between the base region (8) of the parasitic bipolar transistor (B) and the gate input terminal (GT) and a second rectifying element (D2) coupled between the emitter region (26) of the parasitic bipolar transistor (B) and the gate input terminal (GT) for causing, when the voltage difference between the source and insulated gate electrodes (S and G) reverses sign, the first and second rectifying elements (D1 and D2) in series with the base and emitter regions of the parasitic bipolar transistor (B) to become forward-biassed to reduce the voltage between the base and emitter regions of the parasitic bipolar transistor (B) to inhibit turn-on of the parasitic bipolar transistor.

10 Claims, 4 Drawing Sheets

5,466,952

SEMICONDUCTOR DEVICE HAVING AN IGET AND A CONTROL OR PROTECTION COMPONENT

BACKGROUND OF THE INVENTION

This invention relates to a semiconductor device, in particular a semiconductor device comprising an insulated gate field effect transistor integrated within the same semiconductor body as one or more further components for controlling or protecting the insulated gate field effect transistor. The insulated gate field effect transistor may be a vertical power MOSFET of the so-called DMOS type where the term "vertical" means that the main current in normal operation of the MOSFET is between opposed first and second major surfaces Various examples of so-called protected switches or smart power devices have been proposed in which one or more additional components for controlling or protecting the insulated gate field effect transistor are integrated within the same semiconductor body as the insulated gate field effect transistor. For example, U.S. Pat. No. 4,760,434 describes a vertical type MOSFET with on chip thermal and other protection in which some of the additional components are formed as thin film devices provided on top of and isolated from insulated gate field effect transistor or MOSFET and some integrated within an opposite conductivity type isolation well region provided within a first region which generally is an epitaxial layer and forms at least a drain drift region of the semiconductor body. Where such integrated components are provided the possibility for parasitic bipolar transistor action between the components, the isolation well region and the first region arises especially when the voltage at the insulated gate of the insulated gate transistor goes, in the case of an n-channel device, negative with respect to the source voltage. Generally it is not possible to reduce the possibility of such parasitic bipolar problems without altering the thickness and/or doping concentration of the first region in a manner which is detrimental to the characteristics of the MOSFET. Accordingly in such circumstances, a compromise has to be reached between a structure suitable for inhibiting parasitic bipolar action and an optimum structure for the MOSFET.

SUMMARY OF THE INVENTION

It is an aim of the present invention to provide a semiconductor device in which the above mentioned problems are reduced or at least mitigated.

According to the present invention, there is provided a semiconductor device comprising a semiconductor body having first and second major surfaces with a first region of one conductivity type adjacent the first major surface, an insulated gate field effect transistor formed within the first region and having source and drain electrodes and an insulated gate electrode, at least one further component coupled between the insulated gate electrode of the insulated gate field effect transistor and a gate input terminal, the further component requiring a second region of the opposite conductivity type provided within the first region so that a region of the further component, the second region and the first region form a parasitic bipolar transistor and, provided on an insulating layer on the first major surface, a first rectifying element coupled between the base region of the parasitic bipolar transistor and the gate input terminal and a second rectifying element coupled between the emitter region of the parasitic bipolar transistor and the gate input terminal for causing, when the voltage between the source and insulated gate electrodes reverses sign, the first and second rectifying elements in series with the base and emitter regions of the parasitic bipolar transistor to become forward-biassed to reduce the voltage between the base and emitter regions of the parasitic bipolar transistor.

Thus in a semiconductor device in accordance with the invention, the first and second rectifying elements act to reduce the base-emitter voltage of the parasitic bipolar transistor and so reduce the possibility of unwanted bipolar action.

A third rectifying element may be coupled in anti-parallel with the second rectifying element to facilitate the supply of gate drive to the insulated gate field effect transistor under normal operating conditions. A fourth rectifying element may be coupled in series with the second rectifying element to further reduce the base-emitter voltage which can be applied across the parasitic bipolar transistor. The rectifying elements may comprise thin film diodes, for example polycrystalline silicon diodes.

The insulated gate field effect transistor may comprise a vertical insulated gate field effect transistor with the source electrode at the first major surface and the drain electrode at the second major surface. In such a case, the insulated gate field effect transistor may comprise a plurality of second regions of the opposite conductivity type formed within the first region adjacent the first major surface and each containing a source region of the one conductivity type coupled to the source electrode, with the insulated gate electrode overlying a conduction channel area of each second region to define a gateable conductive path between the source regions and the first region which forms at least part of a drain region coupled to the drain electrode of the insulated gate field effect transistor.

The second region may form a well or isolation region within which the at least one further component is formed. In such a case, the at least one further component may comprise an insulated gate field effect transistor of the one conductivity type or a diffused resistor of the one conductivity type formed within the well region. The at least one further component could be an electrostatic protection diode with the second region forming one of the regions of the diode. Also, any two or more of these different types of components may be provided in the semiconductor body.

BRIEF DESCRIPTION OF THE DRAWING

Embodiments of the present invention will now be described, by way of example, with reference to the accompanying drawings, in which.

DESCRIPTION OF THE PREFERRED EMBODIMENTS

Figure 1:
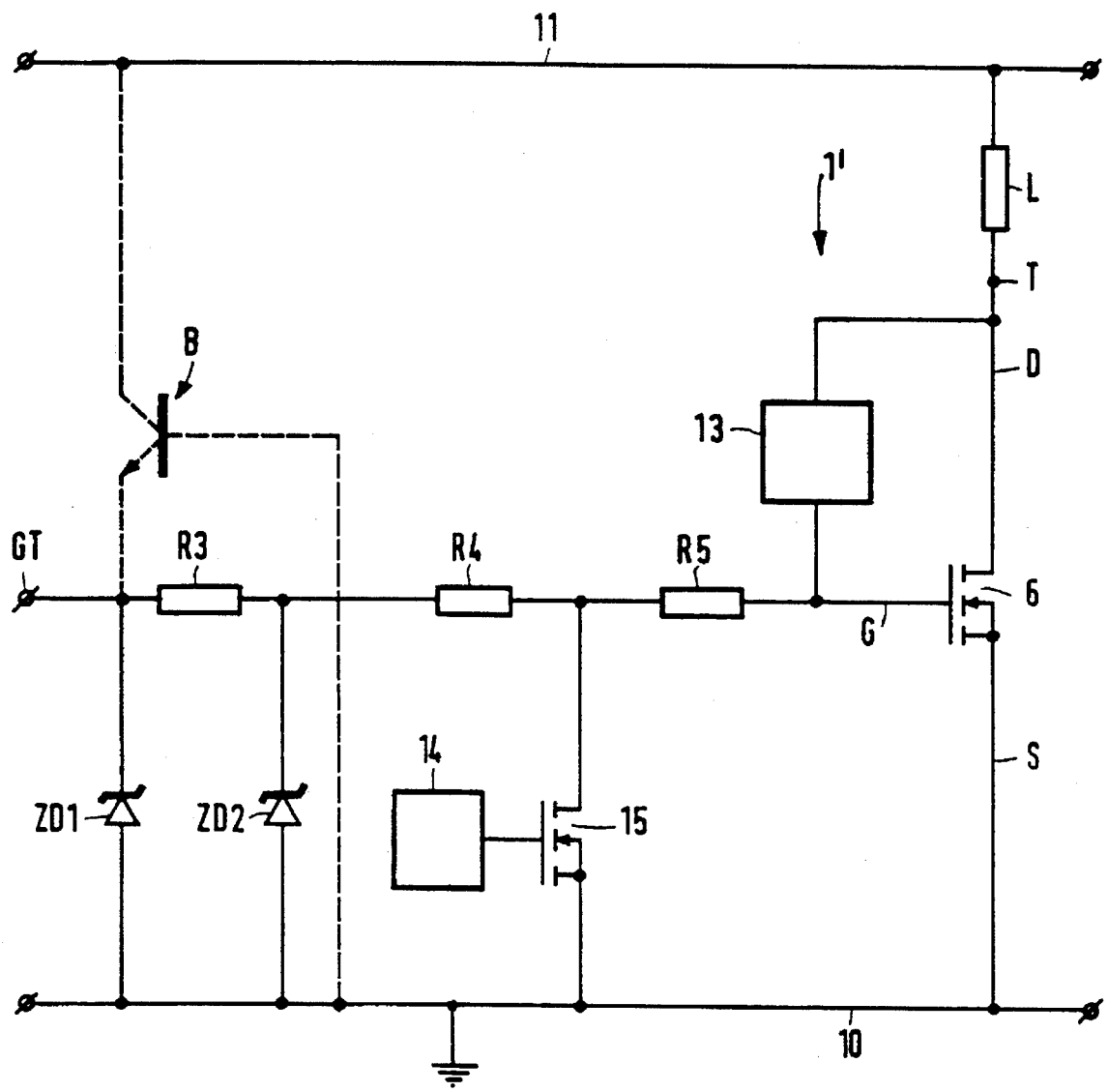
FIG. 1 is a simplified circuit diagram of a known semiconductor device or protected switch.

Referring now to the drawings generally for a preliminary overview, a semiconductor device comprises a semiconductor body 2 having first and second major surfaces 2c and 2d with a first region 2b of one conductivity type adjacent the first major surface 2c, an insulated gate field effect transistor 6 formed within the first region 2b and having source and drain electrodes S and D and an insulated gate electrode G, at least one further component R4, ZD, 15 coupled between the insulated gate electrode G of the insulated gate field effect transistor 6 and a gate input terminal GT, the further component requiring a second region 21 or 29 of the opposite conductivity type within the first region 2b so that a region (for example 26) of the further component (R4)t the second region 21 and the first region 2b form a parasitic bipolar transistor B and, provided on an insulating layer 30 on the first major surface 2c, a first rectifying element D1 coupled between the base region 21 of the parasitic bipolar transistor B and the gate input terminal GT and a second rectifying element D2 coupled between the emitter region 9 of the bipolar transistor B and the gate input terminal GT for causing, when the voltage difference between the source and insulated gate electrodes S and G reverses sign, the first and second rectifying elements D1 and D2 in series with the base and emitter regions of the parasitic bipolar transistor B to become forward-biassed to reduce the voltage between the base and emitter regions of the parasitic bipolar transistor B to inhibit turn on of the parasitic bipolar transistor.

Thus in a semiconductor device in accordance with the invention, the first and second rectifying elements D1 and D2 act to reduce the base-emitter voltage of the parasitic bipolar transistor B and so reduce the possibility of unwanted bipolar action.

Referring now to FIG. 1, there is illustrated a very simplified circuit diagram of a known protected switch 1' marketed by Philips Semiconductors as a TOPFET (Trade Mark) protected switch. The protected switch 1' comprises an n-channel enhancement mode power MOSFET 6 of the vertical DMOS type. The MOSFET 6 is intended to be connected as a low-side switch to a suitable load L such as an automotive light or motor coil or similar. Accordingly, the drain electrode D of the MOSFET 6 is coupled to a terminal T to which one terminal or end of the load L is to be connected while the source electrode S is coupled to a power supply line 10 which in use is coupled to a reference potential, generally ground, and the other terminal of the load L is coupled to a positive voltage supply line 11.

The insulated gate electrode G of the MOSFET 6 is coupled to the gate terminal GT to which an appropriate gate drive circuit will be coupled in use via gate input resistors, three of which R3, R4 and R5 are shown in FIG. 1. A voltage clamping circuit 13 is coupled between the drain and gate electrodes D and G of the MOSFET 6 to protect the MOSFET during switching of an inductive load, in particular to turn the MOSFET back on in the event of an inductive load causing an over-voltage at the drain electrode D. Any suitable form of voltage clamping circuit may be used. Thus, for example, a circuit such as that described in our EP-A-523800 may be used.

One or more protection zener diodes may be provided at the gate input. Two zener diodes ZD1 and ZD2 are shown.

The protected switch shown in FIG. 1 also includes a further protection circuit 14 which is coupled to the gate of an N-channel enhancement mode IGFET 15 having its main source-to-drain current path coupled between the gate G and source S electrodes (as shown to the supply line 10) to cause the gate to be pulled low, connected to ground in this case, in the event of an undesired condition being detected. The undesired condition may be, for example, a short-circuit or over-temperature and the further protection circuit 14 may have any suitable form. Thus, for example, an over-temperature detection circuit such as described in EP-A-360333, EP-A-369530 or EP-A-479362 may be used in appropriate circumstances.

The parasitic bipolar transistor B which is inherent in the protected switch is shown in phantom lines in FIG. 1.

FIG. 2 illustrates by way of cross-sectional views of different pads of a semiconductor body 2 how different components which may be used in a protected switch such as that shown in FIG. 1 may be formed.

The semiconductor body 2 comprises, in this example, a relatively highly doped n conductivity single crystal silicon substrate 2a on which is provided a relatively lowly doped n conductivity type silicon epitaxial layer 2b which forms the first region, generally the drain drift region, of the MOSFET 6.

Figure 2A:
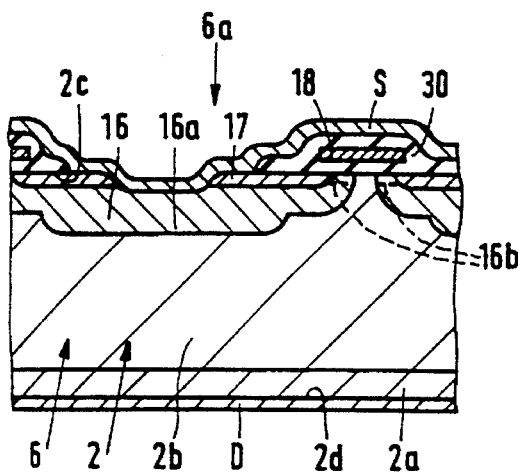
FIGS. 2a, 2b, 2c, 2d, 2e and 2f are cross-sectional views through various parts of a semiconductor body to show typical components used in a protected switch of the type shown in FIG. 1.

The MOSFET 6 is formed using conventional DMOS processing technology and one cell 6a of the MOSFET 6 is shown in FIG. 2a. The cell 6a comprises adjacent one major surface 2c of the semiconductor body 2 a p conductivity body region 16 which contains an n conductivity source region 17 and defines therewith a conduction channel area 16b under the insulated gate 18 of the MOSFET. As shown, the p body region 16 may have a central relatively highly doped subsidiary region 16a which is shorted (either as shown by a moat etched through the source region 17 or by masking the source implant) to the source electrode S to inhibit parasitic bipolar action. The source electrode S and gate electrode G (not shown) are formed by metallization provided on top of an insulating layer 30 and making contact to the source regions 17 and insulated gate 18, respectively, via appropriate contact holes. The drain electrode D is provided on the other major surface 2d of the semiconductor body 2.

Figure 2B:
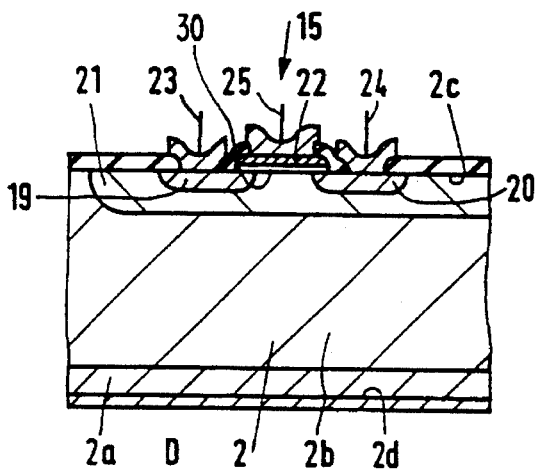

FIG. 2b shows a lateral NMOS transistor, for example the transistor 15 shown in FIG. 1, having source and drain regions 19 and 20 diffused in a p conductivity second region which in this example forms an isolation or well region 21 and an overlying insulated gate 22 and source, gate and drain electrodes 23, 24 and 25 formed on the insulating layer 30. In this case, a parasitic bipolar transistor exists between the source region 19, the well region 21 and the first region 2b.

Figure 2C:
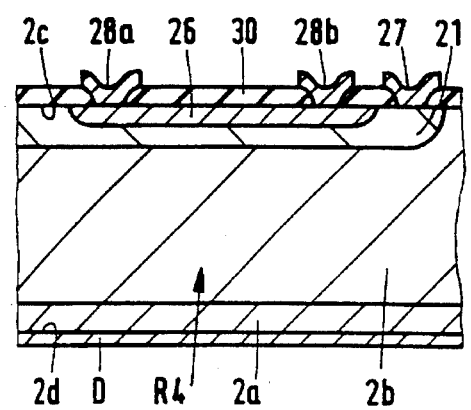

FIG. 2c shows a diffused resistor, for example the resistor R4, which consists of an n conductivity region 26 within a p conductivity well or isolation region which may be the same region 21. An electrode 27 couples the well region 21 to a reference potential which is generally ground and resistor electrodes 28a and 28b are provided at each end of the region 26. In this case, a parasitic bipolar transistor exists between the region 26, the well region 21 and the first region 2b.

Figure 2D:
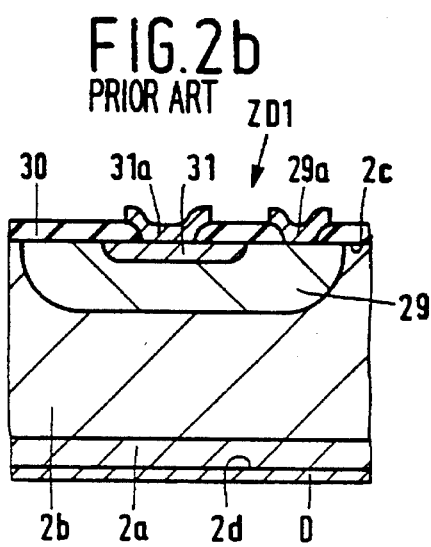

FIG. 2d shows a diffused diode, for example the zener diode ZD1, consisting of a relatively highly doped p conductivity region 29 within which is provided an n conductivity region 31 together with appropriate electrodes 29a and 31a making contact through contact holes in the insulating layer 30. In this example, a parasitic bipolar transistor exists between the first region 2b and the regions 29 and 31 of the diode ZD1.

Figure 2E:
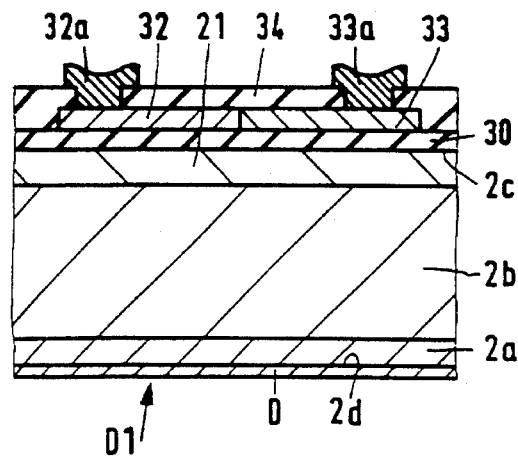
Figure 2F:
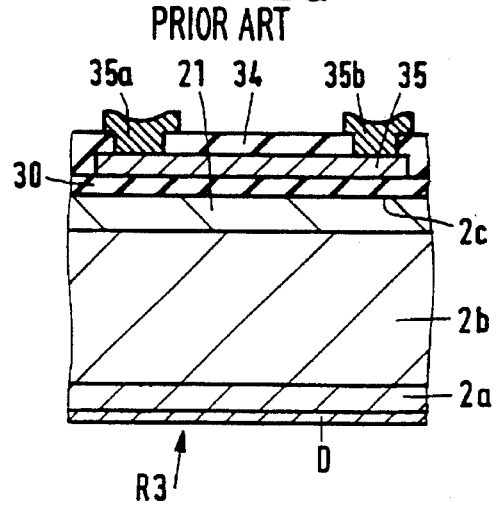

FIG. 2e shows a thin film diode D1 while FIG. 2f shows a thin film resistor, for example R3, formed on top of the insulating layer 30, usually over the well region 21. As shown, the diode D1 is a pn junction diode consisting of oppositely doped regions 32 and 33 of polycrystalline silicon with respective electrodes 32a and 33a making contact through openings in an insulating layer 34 while the resistor R3 is generally formed by an n conductivity doped polycrystalline silicon region 35 with respective electrodes 35a and 35b making contact through openings in the insulating layer 34.

Of course, one or more of each of the above-described components may be provided and the components connected as required by metallization.

Figure 3:
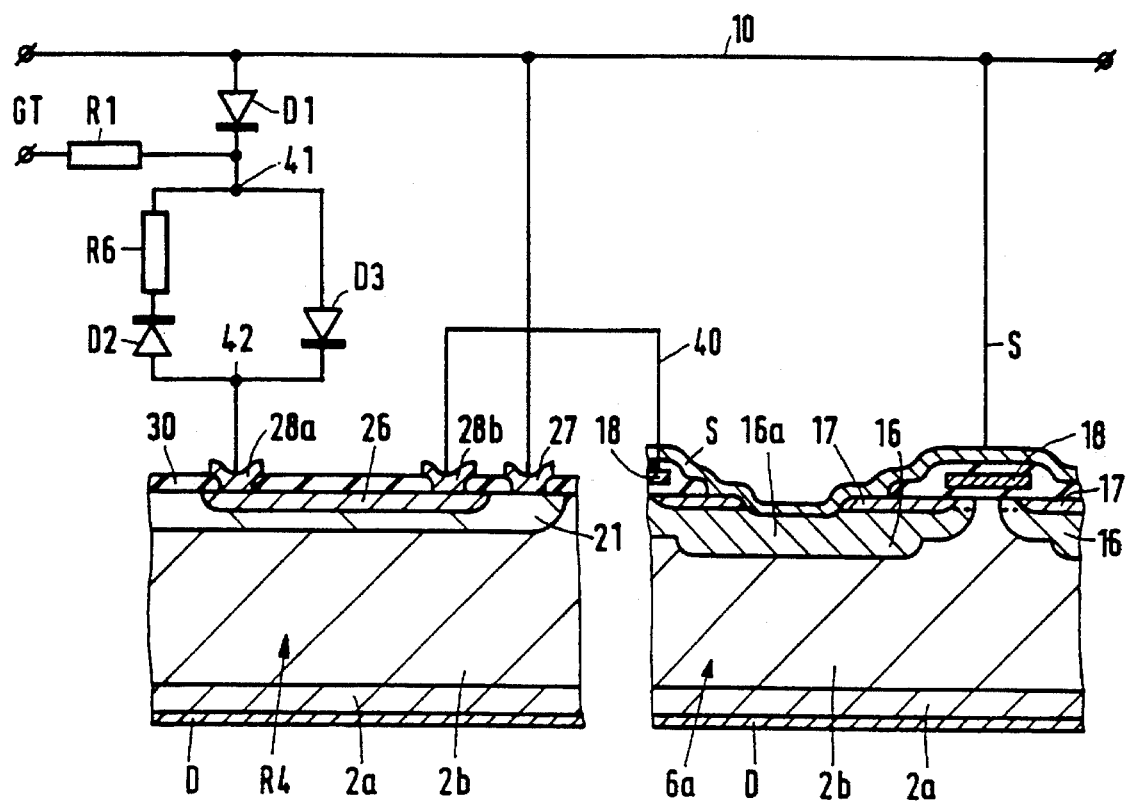
FIG. 3 is a part-cross-sectional, part circuit diagram of a semiconductor device in accordance with the invention.

FIG. 3 illustrates by way of a part-cross-sectional and part circuit diagrammatic drawing, a first example of a semiconductor device in accordance with the invention. For the sake of simplicity, only one cell 6a of the MOSFET 6 is shown and one further component coupled to the insulated gate G of the MOSFET by a line 40 and to the gate input terminal GT via diodes D1, D2 and D3 (as will be described below) is show. The further component is shown as a diffused resistor R4, but could be a diffused lateral N channel MOSFET or a diffused diode as shown in FIG. 2.

Figure 4:
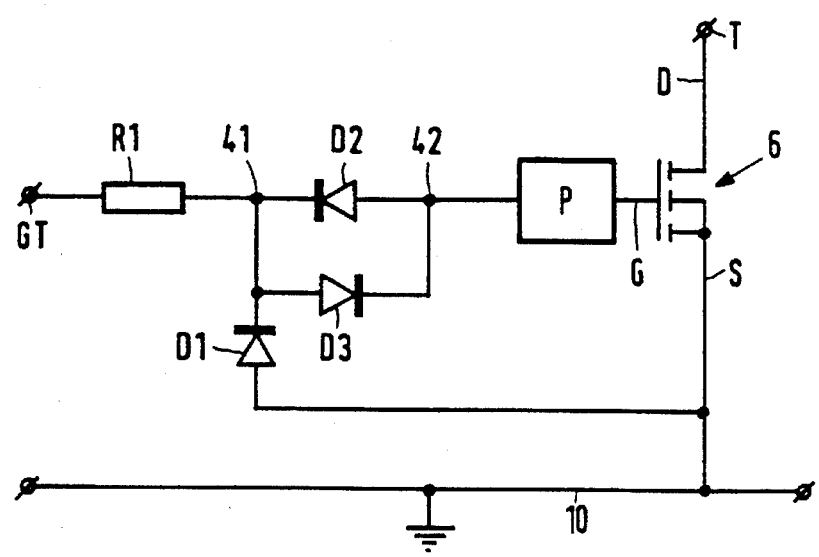
FIG. 4 is a simplified circuit diagram for a semiconductor device in accordance with the invention.

Using the reference numerals of FIG. 2c for simplicity, the electrode 27 is coupled to the source electrode S, that is to the ground power supply line 10, while the resistor electrode 28a is coupled via a node 42 to the anode of the thin film diode D2 and to the cathode of the thin film diode D3. The other electrodes of the two diodes D2 and D3 are coupled via a node 41 to the cathode of a thin film diode D1 having its anode coupled to the source electrode S or supply line 10. An optional thin film resistor R6 may be provided between diode D2 and the node 41. Although not shown in FIG. 3, all of the thin film diodes D1, D2 and D3 are formed on the insulating layer 30 over the semiconductor body 2 in a manner similar to that shown in FIG. 2e. The node 41 between the anode of the diode D3 and the diode D1 is coupled to the gate input terminal GT via a thin film input resistor R1 similar to the resistor R3 shown in FIG. 2f. FIG. 4 is a simplified circuit diagram showing the general circuit where the box labelled P represents the logic components such as the resistor shown in FIG. 3.

This circuit should protect the MOSFET 6 from damage when the voltage at the gate input goes negative with respect to the source voltage of the MOSFET 6.

In normal operation of the circuit shown in FIGS. 3 and 4, the voltage at node 41 will be, typically, 0.5 volts above the input voltage (that is the voltage at node 42) and as the MOSFET is turned off, the input voltage will fall quickly to 0.5 volts and more slowly to zero volts as determined by the internal input-source resistance which may typically be 65 kilo-ohms. When the input voltage is 0.5 volts, the MOSFET 6 will be below threshold and so no current will pass through the load.

Figure 5:
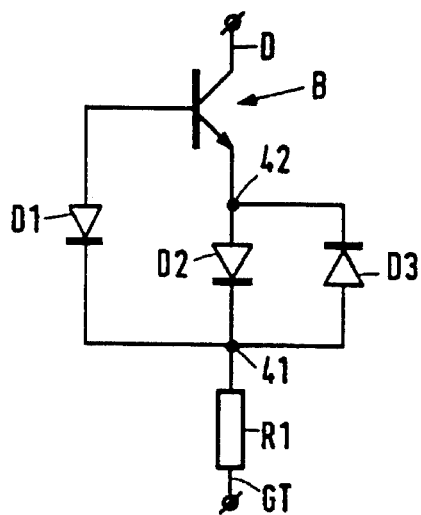
FIG. 5 is a circuit representing the situation when the voltage at the insulated gate of the insulated gate field effect transistor or MOSFET shown in FIG. 4 goes negative with respect to the source voltage.

FIG. 5 is a circuit diagram for illustrating the effect of the parasitic bipolar transistor B formed by the one or more further components. Thus, in the example shown in FIG. 3, the first region 2b forms the collector region (and is coupled to the drain electrode D) of the parasitic bipolar transistor B, the well region 21 forms the base region (and is coupled via the diode D1 to node 41 and to the gate input terminal GT) and an n conductivity region (region 26 in this example) forms the emitter region and is coupled to the node 42. Thus, when the input voltage goes negative with respect to the source voltage (ground in this example), the diode D2 reduces the base-emitter voltage Vbe of the parasitic bipolar transistor B to a proportion (dependent on the diodes D1 and D2) of the forward voltage Vf of the diode D1. Generally, diodes D1 and D2 are similar and so the proportion is a half. This limits the base current of the bipolar transistor B to a negligible value so that the full BVces (collector-emitter saturated voltage) can be achieved. The diode D1 also acts to reduce the thermal leakage base current of the parasitic bipolar transistor B. The diode D3 acts to facilitate normal operation of the MOSFET 6.

The resistor R6 may optionally be provided if a negative voltage is likely to arise at the input for considerably longer than two milliseconds. This resistor R6 should be sufficiently large to keep the current flowing through the input small during a negative input voltage situation.

Figure 6:
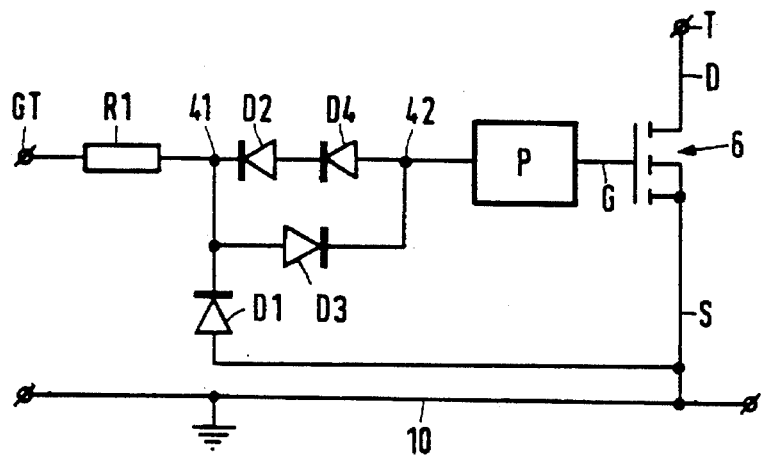
FIG. 6 is a simplified circuit diagram for a modified version of the semiconductor device shown in FIG. 4.
Figure 7:
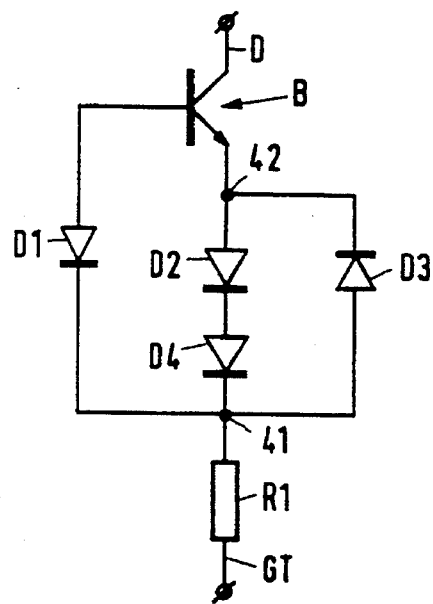
FIG. 7 is a circuit representing the situation when the voltage at the insulated gate of the insulated gate field effect transistor or MOSFET goes negative with respect to the source voltage for the modified semiconductor device shown in FIG. 6.

FIGS. 6 and 7 illustrate an alternative in which a further thin film diode D4 is provided in series with the diode D2. Assuming the diodes are similar then this arrangement will reduce the Vbe of the parasitic transistor B to one third (as opposed to a half in FIGS. 4 and 5) of the Vf of the diode D1 and will also comparatively reduce the turn off time of the MOSFET 6. Of course, further diodes could be added to further reduce the Vbe of the parasitic transistor B.

A semiconductor device in accordance with the invention should thus avoid or at least reduce the possibility of parasitic bipolar action due to further components such as those mentioned above integrated in the semiconductor body 2, may also remove the need for integral ESD protection diodes and certainly should assist in avoiding the situation where parasitic bipolar action arises because the parasitic bipolar transistor which is part of the ESD protection diode has a BVceo lower than the voltage at which the clamping circuit 13 operates.

Where the MOSFET 6 is acting as a low-side switch as shown in FIG. 1, then a negative input voltage can be created by a combination of high current in the MOSFET 6, significant wiring resistance between the source electrode and ground or if separate grounds are used for the MOSFET and the gate driving circuit. Thus if the MOSFET 6 is turned off while a high current is flowing, the clamping circuit may become operational and a voltage may be generated in the source-ground wiring which, in the absence of the present invention, would provide a voltage greater than the Vbe of the parasitic bipolar transistor B. The present invention thus prevents or at least inhibits failure of the MOSFET under such circumstances.

With appropriate modification, the present invention may be applied to a high-side switch, that is where the MOSFET 6 is connected between the positive power supply line 11 and the load L to inhibit the turn on of parasitic bipolar transistors which might otherwise arise if a supply line 11 overvoltage transient results in the clamping circuit 13 operating causing the MOSFET to conduct and potentially raising the potential of the source above ground so that, if the gate is held at ground, the gate becomes negative with respect to the source.

The present invention could be applied to P channel devices with appropriate modification and it should be understood that a reference to the voltage difference between the source and gate reversing sign means the situation when this voltage difference is of the opposite sign to that required for the MOSFET 6 to be conducting. Of course, the diode D1, D2 and D3 arrangement could be provided for one or more of any further components integrated with the MOSFET, depending upon the likelihood of a particular component causing parasitic bipolar action. The present invention could of course be applied to semiconductor materials other than silicon.

From reading the present disclosure, other modifications and variations will be apparent to persons skilled in the art. Such modifications and variations may involve other features which are already known in the art and which may be used instead of or in addition to features already described herein.

I claim:

1. A semiconductor device comprising a semiconductor body having first and second major surfaces with a first region of one conductivity type adjacent the first major surface, an insulated gate field effect transistor formed within the first region and having source and drain electrodes and an insulated gate electrode, at least one further component coupled between the insulated gate electrode of the insulated gate field effect transistor and a gate input terminal, the further component having a second region of the opposite conductivity type provided within the first region so that a further region of the further component, the second region and the first region form a parasitic bipolar transistor and, provided on an insulating layer on the first major surface, a first rectifying element coupled between a base region of the parasitic bipolar transistor and the gate input terminal and a second rectifying element coupled between an emitter region of the parasitic bipolar transistor and the gate input terminal for causing, when a voltage between a source and an insulated gate electrode reverses polarity, the first and second rectifying elements in series with a base and an emitter region of the parasitic bipolar transistor to become forward-biased to reduce a voltage between the base and emitter regions of the parasitic bipolar transistor.

2. A semiconductor device according to claim 1, wherein a third rectifying element is coupled in parallel with and with opposite polarity to the second rectifying element.

3. A semiconductor device according to claim 2, wherein a fourth rectifying element is coupled in series with the second rectifying element.

4. A semiconductor device according to claim 1, wherein the rectifying elements comprise thin film diodes.

5. A semiconductor device according to claim 4, wherein the thin film diodes comprise polycrystalline silicon diodes.

6. A semiconductor device according to claim 1, wherein the insulated gate field effect transistor comprises a vertical insulated gate field effect transistor with the source electrode at the first major surface and the drain electrode at the second major surface.

7. A semiconductor device according to claim 6, wherein the insulated gate field effect transistor comprises a plurality of second regions of the opposite conductivity type formed within the first region adjacent the first major surface and each containing a source region of the one conductivity type coupled to the source electrode, with the insulated gate electrode overlying a conduction channel area of each second region to define a gateable conductive path between the source regions and the first region which forms at least part of a drain region coupled to the drain electrode of the insulated gate field effect transistor.

8. A semiconductor device according to claim 1, wherein the second region forms a well region and the at least one further component comprises a diffused resistor of the one conductivity type formed within the well region.

9. A semiconductor device according to claim 1, wherein the second region forms a well region and the at least one further component comprises at least one insulated gate field effect transistor of the one conductivity type formed within the well region.

10. A semiconductor device according to claim 1, wherein the at least one further component comprises an electrostatic protection diode.

\* \* \* \* \*